United States Patent
Lin et al.

(10) Patent No.: US 8,562,163 B2
(45) Date of Patent: Oct. 22, 2013

(54) POWER TRANSMISSION CIRCUIT WITH EMI SHIELDING, LIGHTING MODULE, AND PANEL DISPLAY MODULE

(75) Inventors: Chun-Hsien Lin, Hsin-Chu (TW);
Tsung-Hung Lee, Hsin-Chu (TW);
Chih-Liang Pan, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 401 days.

(21) Appl. No.: 13/029,177

(22) Filed: Feb. 17, 2011

(65) Prior Publication Data
US 2011/0234098 A1    Sep. 29, 2011

(30) Foreign Application Priority Data

Mar. 29, 2010  (TW) .............................. 99109339 A

(51) Int. Cl.
*G09F 13/04* (2006.01)
(52) U.S. Cl.
USPC ........................................ 362/97.1; 362/631
(58) Field of Classification Search
USPC .............. 362/97.1, 97.2, 97.3, 615, 630, 631; 439/607.01
See application file for complete search history.

(56) References Cited

U.S. PATENT DOCUMENTS

| | | | |
|---|---|---|---|
| 7,673,999 B2 * | 3/2010 | Back et al. ................... | 362/97.2 |
| 2008/0238881 A1 | 10/2008 | Perski et al. | |
| 2008/0266905 A1 * | 10/2008 | Yeh ............................... | 362/630 |
| 2009/0126972 A1 | 5/2009 | Matsushita et al. | |
| 2009/0128471 A1 * | 5/2009 | Hsiao et al. ...................... | 345/88 |

FOREIGN PATENT DOCUMENTS

| | | | |
|---|---|---|---|
| CN | 101877933 A | | 11/2010 |
| JP | 2005-093178 | * | 4/2005 |
| TW | 200844811 | | 11/2008 |
| TW | 200937459 | | 9/2009 |

OTHER PUBLICATIONS

Taiwan Office Action dated Jun. 14, 2012.
English translation of abstract of CN 101877933A.

* cited by examiner

*Primary Examiner* — Thuy Vinh Tran
(74) *Attorney, Agent, or Firm* — McClure, Qualey & Rodack, LLP

(57) ABSTRACT

A power transmission circuit, a light source module including the power transmission circuit, and a panel display device are provided. The power transmission circuit includes a substrate, a power transmission layer, a metal shielding layer, a first protective layer, and a second protective layer. The substrate has a first surface and a second surface with the power transmission layer and the metal shielding layer respectively formed thereon. The metal shielding layer covers a projection region of a transmission section of the power transmission layer. The first and second protective layers are respectively disposed on the power transmission layer and the metal shielding layer and opposite to the substrate to protect the power transmission layer and the metal shielding layer.

19 Claims, 4 Drawing Sheets

POWER TRANSMISSION CIRCUIT WITH EMI SHIELDING, LIGHTING MODULE, AND PANEL DISPLAY MODULE

BACKGROUND OF THE INVENTION

1. Field of the Invention

The present invention relates generally to a power transmission circuit, and a light source module and a panel display module that include the power transmission circuit. Particularly, the present invention relates to a power transmission circuit with electromagnetic shielding effect, and a light source module and a panel display module that include the power transmission circuit.

2. Description of the Prior Art

Liquid crystal displays (LCD) are widely used in computers, televisions, cell phones, and other related electronic devices. In liquid crystal displays, the backlight module plays an important role among all other liquid crystal display components in directly influencing the performance of the liquid crystal display. The light source module used in the backlight module directly affects the performance of the backlight module as well as the assembly cost.

FIG. 1 is a schematic view of a conventional liquid crystal display. The liquid crystal display includes a display panel 10 and a backlight module 30 disposed on the back side of the display panel 10. The backlight module 30 includes a light-guide plate 31 and a light source module 33. The light source module 33 is composed of a light-emitting device 51, a power transmission circuit 53, and a driver module 55. A plurality of light-emitting units 70 are disposed on the light-emitting device 51, facing one side of the light-guide plate 31. When the light-emitting device 51 receives from the power transmission circuit 53 a power signal sent by the driver module 55, the light-emitting unit 70 emits light to the light-guide plate 31. Since the light-emitting device 51 often requires heat dissipation, the light-emitting device 51 is typically disposed away from the driver module 55, which leads to the disposition of the power transmission circuit 53 across the back of the display panel 10. As such, there is a possibility of the power transmission circuit 53 to cause an electromagnetic interference to the other electronic components in the module by way of the electromagnetic noise that is produced by the power transmission circuit 53 during the power signal transmission. In addition, since there is currently no suitable design for the protection of power transmissions from electrostatic discharges (ESD), the power transmission circuit 53 may be easily targeted by ESD and lead to further damage to the light-emitting device 51 and the light-emitting unit 70.

On the other hand, since liquid crystal displays are widely used in laptop computers and other electronic devices, and the volume of electronic product is targeted to be minimized, some components of the laptop computers or other electronic devices are disposed within the liquid crystal display module. As shown in FIG. 1, in order to achieve optimum angle for the antenna, the receiving antenna 90 is disposed in LCD in the vicinity of the power transmission circuit 53. As such, the electromagnetic noise which the power transmission circuit 53 produces when transmitting the power signal will interfere with the performance of the receiving antenna 90.

SUMMARY OF THE INVENTION

It is an object of the present invention to provide a power transmission circuit, and a light source module and a panel display module that include the power transmission circuit, to decrease the likelihood of electromagnetically interfering through electromagnetic noises with other electronic components within the panel display module.

It is another object of the present invention to provide a power transmission circuit and a light source module including the power transmission circuit to have better protection from electrostatic discharges.

The present invention achieves these and other objectives by providing a panel display device having a light source module. The light source module is mainly composed of a power transmission circuit and a light-emitting device. The power transmission circuit includes a substrate, a power transmission layer, a metal shielding layer, a first protective layer, and a second protective layer. The substrate has a first surface and a second surface, and the power transmission layer and the metal shielding layer are formed on the first surface and the second surface, respectively. The power transmission layer has a transmission section and a second connection end, wherein the second connection end is electrically connected to an end of the transmission section. The second connection end is provided for connecting to the first connection end of the light-emitting device so that the power signal may be transmitted from the transmission section to the light-emitting device. The first protective layer is disposed on a side of the power transmission layer facing away from the substrate and is made of an insulating material to protect the power transmission layer.

The metal shielding layer covers a projection region of the transmission section of the power transmission layer on the substrate and exposes a projection region of the second connection end on the substrate. The second protective layer is disposed on a side of the metal shielding layer facing way from the substrate. In other words, the metal shielding layer is sandwiched between the second protective layer and the substrate. The second protective layer is made of an insulating material to protect the metal shielding layer.

The primary function of the power transmission layer is to receive from the system power the power signal, and then to transmit the required amount of electricity to the light-emitting device in order to generate light. When the power signal passes through the power transmission layer, an electromagnetic interference will be produced that may affect the neighboring electronic components or modules. The electromagnetic noise may be decreased through the disposition of the metal shielding layer in order to reduce the interference with the light-emitting device of the power transmission circuit and protect the light-emitting device of the power transmission circuit from electrostatic discharge damage, further achieving the goal of protecting the module.

DETAILED DESCRIPTION OF THE PREFERRED EMBODIMENT

A power transmission circuit, and a light source module and a panel display module that include the power transmission circuit are provided. The power transmission circuit primarily transmits power signals and not data signals. In the preferred embodiment, the power transmission circuit is connected to the light-emitting devices, such as a LED light bar, to form the light source module. In addition, the light-emitting device 100 shown in FIG. 2 has a first connection end 110. The form of the first connection end 110 is preferably a solder point that the power transmission circuit 300 can solder to in order to become a welded connection. However, in other embodiments, the first connection end 110 may be a male or female connector to connect with the power transmission circuit 300.

Figure 1:
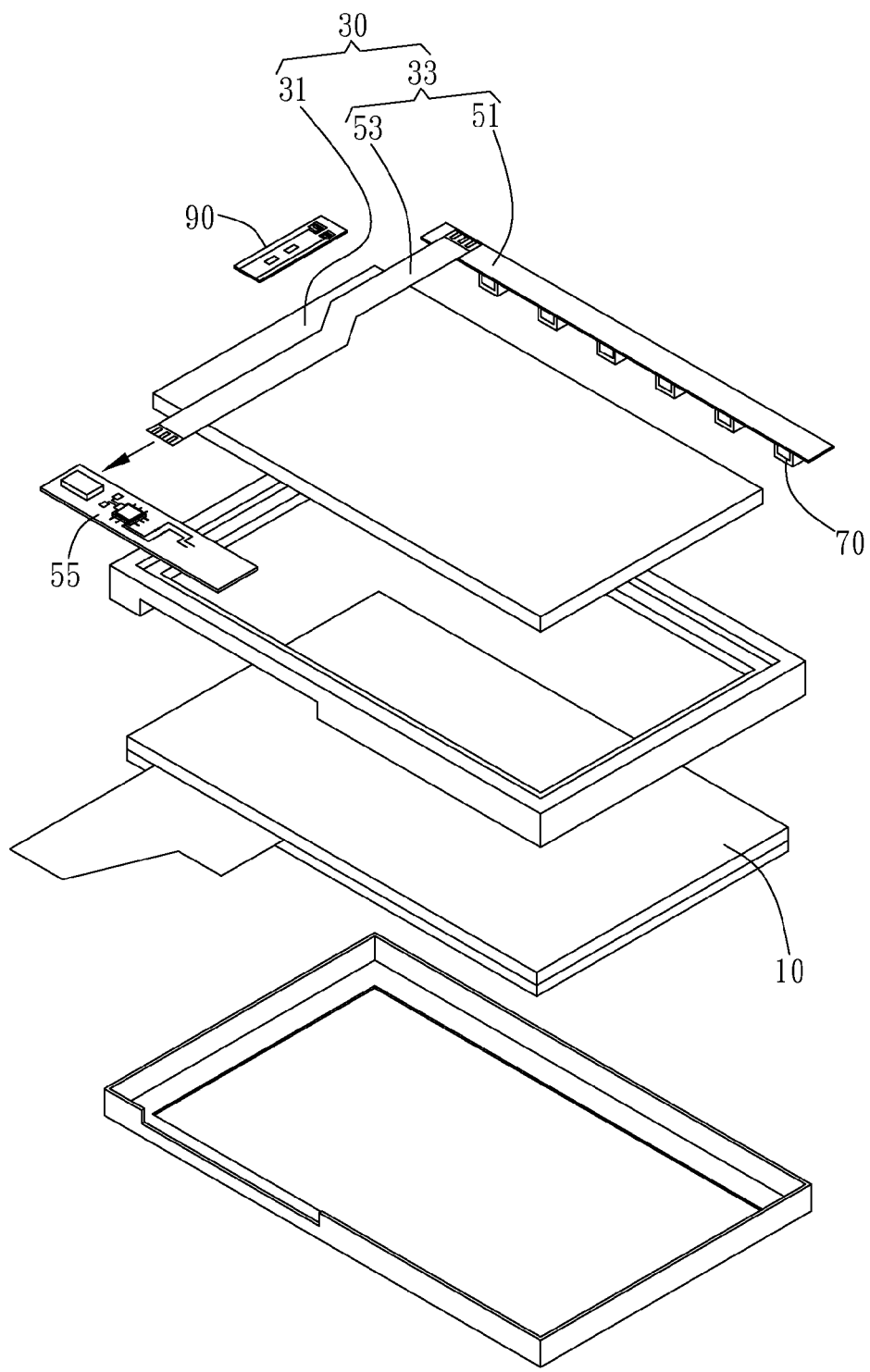
FIG. 1 is a schematic view of the traditional LCD.
Figure 2:
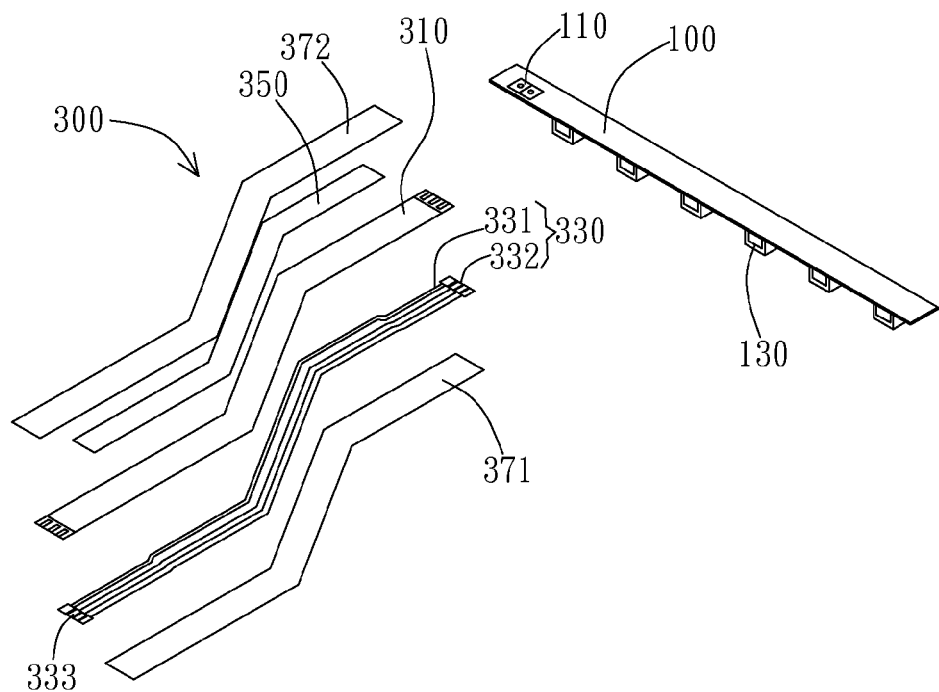
FIG. 2 is a schematic view of an embodiment of the power transmission circuit and the lighting-emitting device.

As shown in FIG. 2, the power transmission circuit 300 is preferably shaped as an elongated strip or elongated slab and includes a substrate 310, a power transmission layer 330, a metal shielding layer 350, a first protective layer 371, and a second protective layer 372. The substrate 310 is preferably a base layer of a flexible printed circuit (FPC) and in the shape of a long strip or long slab. The substrate 310 may be formed in the shape of an "L" or may be shaped in other forms according to the requirements. However, in other embodiments, the substrate 310 may be made of a printed circuit board (PCB).

Figure 3:
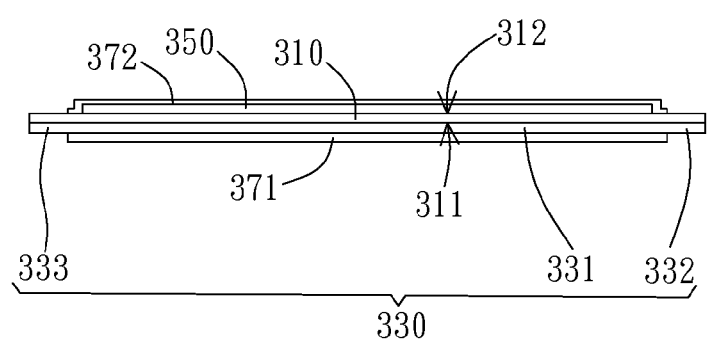
FIG. 3 is a cross-sectional view of an embodiment of the power transmission circuit.

As shown in FIGS. 2 and 3, the substrate 310 has a first surface 311 and a second surface 312, wherein the power transmission layer 330 and the metal shielding layer 350 are disposed on the first surface 311 and the second surface 312, respectively. In other words, the power transmission layer 330 and the metal shielding layer 350 are located on two opposite surfaces of the substrate 310. In the preferred embodiment, the power transmission layer 330 and the metal shielding layer 350 are made from metals such as copper, gold, nickel, or an alloy thereof. Other metals with relatively higher electrical conductivity may also be utilized. Moreover, the power transmission layer 330 and the metal shielding layer 350 may utilize same or different metal. For instance, metals with relatively higher electrical conductivity may be utilized in the power transmission layer 330, while metals that provide better protection from electrostatic discharges or electromagnetic interference may be utilized in the metal shielding layer 350. Considering the electrical conductivity of the power transmission layer 330, the width or the thickness of the power transmission layer 330 may be increased in size to be greater than that of the metal shielding layer 350. Conversely, in considering the effectiveness of the shielding provided by the metal shielding layer 350, the width or the thickness of the metal shielding layer 350 may be increased in size to be greater than that of the power transmission layer 330. The power transmission layer 330 and the metal shielding layer 350 are preferably directly adhered to the substrate 310, with the required conductive traces formed thereon through FPC fabrication or through other laminating or fabricating methods. Examples of a fabrication method for consideration may include methods such as developing-etching fabrication.

As shown in FIGS. 2 and 3, the power transmission layer 330 has a transmission section 331, a second connection end 332, and a third connection end 333, wherein the second connection end 332 and the third connection end 333 are respectively connected to the two ends of the transmission section 331. In the present embodiment, the transmission section 331, the second connection end 332, and the third connection end 333 are formed on the same line through developing-etching fabrication, wherein the second connection end 332 is comparatively closer than the transmission section 331 to one end of the substrate 310 while the third connection end 333 is comparatively closer than the transmission section 331 to the other end of the substrate 310. The second connection end 332 provided for electrically connecting to the first connection end 110 of the light-emitting device 100 may be connected together through soldering or through connectors. As shown in FIG. 3, the first protective layer 371 is disposed on a side of the power transmission layer 330 facing away from the substrate 310. In short, the power transmission layer 330 is sandwiched between the first protective layer 371 and the substrate 310. The first protective layer 371 is made of an insulating material to provide protection for the power transmission layer 330. In the preferred embodiment, the first protective layer 371 completely covers the transmission section 331 of the power transmission layer 330 while exposing the second connection end 332 to allow the second connection end 332 to connect to the first connection end 110.

As shown in FIGS. 2 and 3, the metal shielding layer 350 covers the projection region of the transmission section 331 on the substrate 310 and exposes the projection region of the second connection end 332 on the substrate 310. The projection region of the third connection end 333 on the substrate 310 may also be exposed by the metal shielding layer 350. The word "covers" mentioned herein is limited to completely covering the projection region of the transmission section 331. For instance, if the metal shielding layer 350 is in the form of a net or a form with holes therein, then as long as the distribution of the metal shielding layer 350 covers the projection region of the transmission section 331, the effect of covering will have been achieved. In addition, even if the distribution of metal shielding layer 350 only covers an area smaller than the projection region of the transmission section 331 on the substrate 310, wherein the projection region of the transmission section 331 is only partly covered, the covering is still in accordance to the meaning of "covering" herein mentioned in the present invention. As shown in the present embodiment in FIG. 2, the metal shielding layer 350 is formed of a metal film and completely covers the projection region of the transmission section 331 on the substrate 310.

As shown in FIG. 3, the second protective layer 372 is disposed on a side of the metal shielding layer 350 facing away from the substrate 310. In other words, the metal shielding layer 350 is sandwiched between the second protective layer 372 and the substrate 310. The second protective layer 372 is made of an insulating material to provide protection for the metal shielding layer 350.

The core purpose of the power transmission layer 330 is to receive the power signal from the system power, and then to transmit the required power to the light-emitting units 130 of the light-emitting device 100 to generate light. Electromagnetic noise is generated when the power signal passes through the power transmission layer 330, causing electromagnetic interference to neighboring components and modules. Through the disposition of the metal shielding layer 350, the electromagnetic interference caused by the power signal to neighboring electronic components or modules can be decreased. Moreover, through the disposition of the metal shielding layer 350, the light-emitting device 100 and the power transmission circuit 300 are protected from electrostatic discharge damage in order to further effectively protect the module.

The difference between a typical data signal and the power signal of the present invention is that unlike the typical data signal, the power signal is not as complicated in waveform. The reason behind this is that the transmission in the power transmission layer 330 is purely of a direct or alternating current with a power level necessary only to enable the light-emitting unit 130 of the light-emitting device 100 to generate light. As a result, the waveform of the power signal of the present invention is simpler in nature, and thus the power transmission layer 330 produces relatively smaller electromagnetic interference to that of the data signal. Under these conditions, the metal shielding layer 350 preferably is isolated from the ground potential of the system. In other words, the metal shielding layer 350 does not need to be grounded in order to provide shielding from the electromagnetic interference that is generated by the power transmission layer 330. In addition, since the metal shielding layer 350 is isolated from the ground potential of the system, electromagnetic interference seeping in from the ground potential may be avoided. With this design, the metal shielding layer 350 preferably is not connected to any of the external signal source entities and forms an isolated shielding layer. In other words, the metal shielding layer 350 is independently suspended on the substrate 310, and is isolated from external signals.

Figure 4:
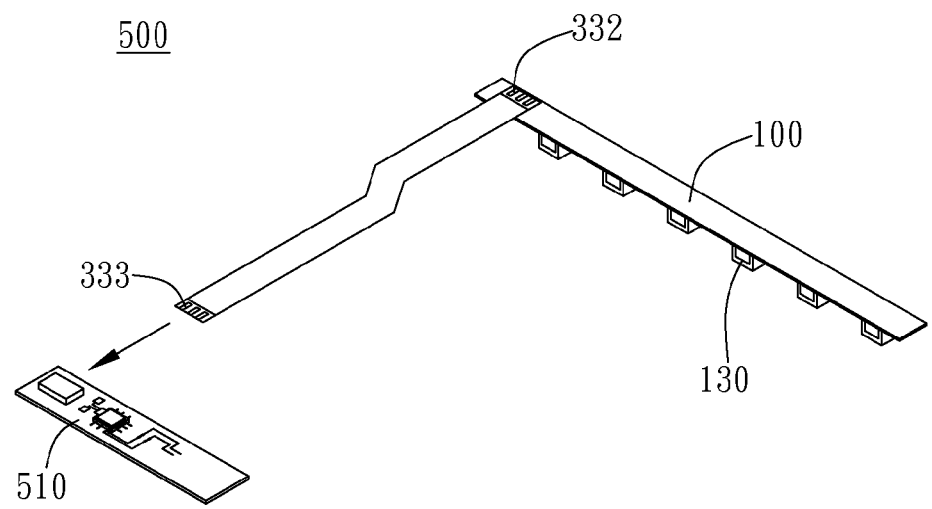
FIG. 4 is a schematic view of the light source module.

As shown in FIG. 4, the light source module 500 is formed by connecting the first connection end 110 of the light-emitting device 100 to the second connection end 332 of the power transmission circuit 300. In the present embodiment, the light source module 500 further includes a driver module 510 electrically connected to the third connection end 333 of the power transmission layer 330. The driver module 510 generates and transmits the power signal to the light-emitting device 100 through the transmission section 331 of the power transmission layer 330. As mentioned above, electromagnetic interference is generated during the transmission of the power signal. The generated electromagnetic interference is then shielded by the metal shielding layer 350 to prevent interference to other neighboring electronic components or modules.

Figure 5:
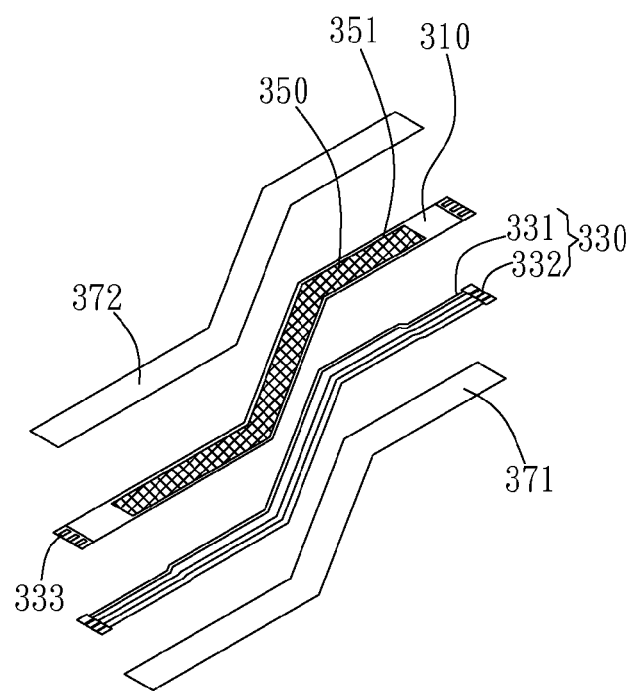
FIG. 5 is a schematic view of another embodiment of the power transmission circuit.

As shown in the embodiment in FIG. 5, the metal shielding layer 350 is in the form of a metal net. In the present embodiment, although the area of the metal net does not completely cover the area of the total projection region of the transmission section 331 in the power transmission layer 330, the distribution of the metal net still covers the projection region of the transmission section 331. Through this metal net design, the resistance to the power flow at the bends of the power transmission circuit 300 can be decreased, while the decreased level of electromagnetic interference to other neighboring components as well as protection from electrostatic discharges may still be maintained. In addition, the metal net has a frame 351 that forms the edges of the metal shielding layer 350. In the preferred embodiment, the frame 351 resides with a certain distance within the boundaries set by the edges of the substrate 310. Through this design, the second protective layer 372 can effectively cover the metal shielding layer 350 without exposing its edges. This design may also be utilized if the metal shielding layer 350 is formed of a metal film in order to keep the edges of the metal film inside the edges of the substrate 310.

Figure 6:
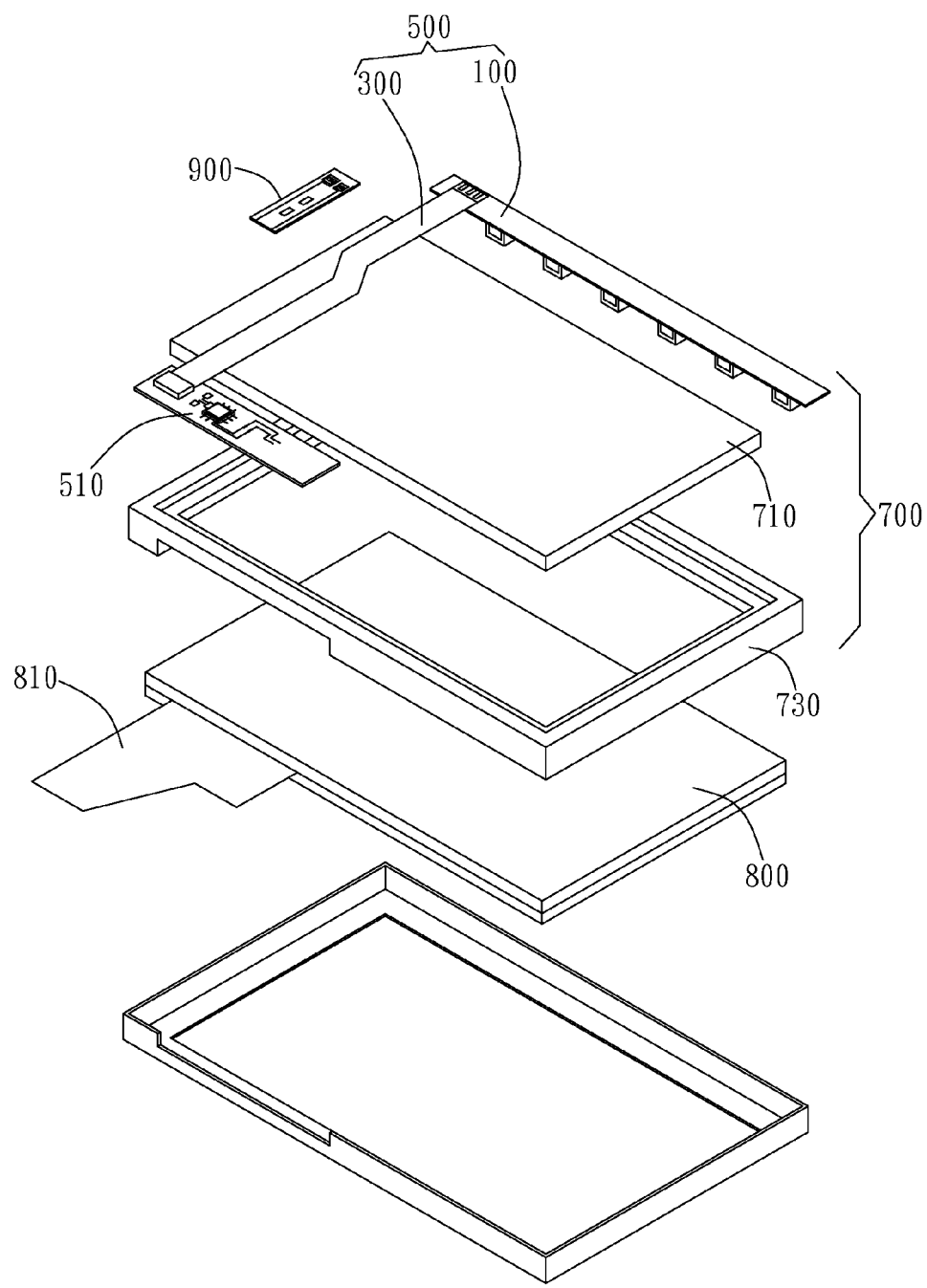
FIG. 6 is a schematic view of an embodiment of the panel display device.

FIG. 6 is schematic view of an embodiment of the panel display device utilizing the light-emitting device 100 and the power transmission circuit 300 described above. As shown in FIG. 6, a backlight module 700 is disposed on the backside of the display panel 800. The backlight module 700 includes the light source module 500 that is composed of the mentioned light-emitting device 100 and power transmission circuit 300, and further includes a light guide plate 710 and a frame 730. The light-emitting device 100 is disposed on an edge of the light guide plate 710 and emits light towards the light guide plate 710. The second connection end 332 of the power transmission circuit 300 is electrically connected to the first connection end 110 of the light-emitting device 100. The power transmission circuit preferably is distributed extending along another edge of the light guide plate 710.

As shown in FIG. 6, the power transmission layer 330 of the power transmission circuit 300 is disposed between the metal shielding layer 350 and the light guide plate 710 or the whole backlight module 700. In other words, the metal shielding layer 350 is disposed outside of the power transmission layer 330. The light guide plate 710 and the light-emitting device 100 are preferably disposed within the frame 730, while the power transmission circuit 300 can be disposed on top or within the frame 730. The light source module 500 additionally includes a driver module 510 that is preferably disposed on an end of the light guide plate 710 opposite to the light-emitting device 100 and can integrate with the control circuit substrate 810 of the display panel 800. The light guide plate 710 or the whole backlight module 700, along with the metal shielding layer 350 can together shield the noise generated by the power signal. In addition, a metal film may be additionally disposed on the side of the power transmission circuit 300 facing the backlight module 700 to strengthen the electromagnetic wave.

As shown in FIG. 6, the panel display device further includes an antenna module 900. The antenna module 900 is preferably disposed on the frame 730 of the backlight module 700 in the vicinity of the power transmission circuit 300. In the present embodiment, the antenna module 900 is disposed in parallel on a side of the power transmission circuit 300. In other embodiments, the antenna module 900 may be disposed on the other side of the frame 730 vertical to the power transmission circuit 300. Since the antenna module 900 is sensitive to the electromagnetic noise, the effects of electromagnetic interference from the power signal traveling through the power transmission layer 330 may be decreased with the disposition of the metal shielding layer 350.

Although the preferred embodiments of the present invention have been describe herein, the above description is merely illustrative. Further modification of the invention herein disclosed will occur to those skilled in the respective arts and all such modifications are deemed to be within the scope of the invention as defined by the appended claims.

What is claimed is:

1. A power transmission circuit for connecting a light-emitting device having a first connection end, the power transmission circuit comprising:
    a substrate having a first surface and a second surface;
    a power transmission layer disposed on the first surface of the substrate, wherein the power transmission layer includes a transmission section and a second connection end, the transmission section is electrically connected to the second connection end, the second connection end is provided for connecting to the first connection end;
    a first protective layer disposed on a side of the power transmission layer facing away from the substrate;
    a metal shielding layer disposed on the second surface of the substrate, wherein the metal shielding layer covers a projection region of the transmission section and exposes a projection region of the second connection end, and an edge of the metal shielding layer is inside an edge of the substrate; and
    a second protective layer disposed on a side of the metal shielding layer facing away from the substrate, wherein the second protective layer covers the metal shielding layer without exposing the edge of the metal shielding layer.

2. The power transmission circuit of claim 1, wherein the metal shielding layer is formed as a metal net.

3. The power transmission circuit of claim 1, wherein the metal shielding layer is formed as a metal film.

4. The power transmission circuit of claim 1, wherein the metal shielding layer is isolated from a ground potential.

5. The power transmission circuit of claim 1, wherein the power transmission layer comprises a third connection end for connecting another end of the transmission section, and a projection region of the third connection end is exposed by the metal shielding layer.

6. A light source module, comprising:
a light-emitting device including a first connection end;
a power transmission circuit, comprising:
a substrate having a first surface and a second surface;
a power transmission layer disposed on the first surface of the substrate, wherein the power transmission layer has a transmission section and a second connection end, the transmission section is electrically connected to the second connection end, the second connection end is provided for connecting to the first connection end;
a first protective layer disposed on a side of the power transmission layer facing away from the substrate;
a metal shielding layer disposed on the second surface of the substrate, wherein the metal shielding layer covers a projection region of the transmission section and exposes a projection region of the second connection end, and an edge of the metal shielding layer is inside an edge of the substrate; and
a second protective layer disposed on a side of the metal shielding layer facing away from the substrate, wherein the second protective layer covers the metal shielding layer without exposing the edge of the metal shielding layer.

7. The light source module of the claim 6, wherein the metal shielding layer is formed as a metal net.

8. The light source module of claim 6, wherein the metal shielding layer is formed as a metal film.

9. The light source module of claim 6, wherein the metal shielding layer is isolated from a ground potential.

10. The light source module of claim 6, wherein the power transmission layer comprises a third connection end for connecting another end of the transmission section, and a projection region of the third connection end is exposed by the metal shielding layer.

11. The light source module of claim 10, further comprising a driver module connected to the third connection end, wherein the driver module generates a noise signal when transmitting a power signal to the light-emitting device through the transmission section of the power transmission layer, and the metal shielding layer shields the noise signal.

12. A panel display device, comprising:
a display panel; and
a backlight module disposed on a backside of the display panel, the backlight module comprising a light source module and a light-guide plate, the light source module comprising:
a light-emitting device including a first connection end and emitting light toward the light-guide plate;
a power transmission circuit across the light-guide plate and comprising:
a substrate having a first surface and a second surface, wherein the first surface faces the display panel;
a power transmission layer disposed on the first surface of the substrate, wherein the power transmission layer has a transmission section and a second connection end, the transmission section is electrically connected to the second connection end, and the second connection end connects to the first connection end;
a first protective layer disposed on a side of the power transmission layer facing away from the substrate;
a metal shielding layer disposed on the second surface, wherein the metal shielding layer covers a projection region of the transmission section and exposes a projection region of the second connection end; the power transmission layer is disposed between the metal shielding layer and the light-guide plate, and the metal shielding layer and the light-guide plate together shield a noise generated by a power signal; and
a second protective layer disposed on a side of the metal shielding layer facing away from the substrate.

13. The panel display device of claim 12, further comprising an antenna module disposed near the power transmission circuit, wherein the metal shielding layer shields a noise signal that is generated when the transmission section of the power transmission layer transmits a power signal.

14. The panel display device of claim 12, wherein the metal shielding layer is formed as a metal net.

15. The panel display device of claim 12, wherein the metal shielding layer is formed as a metal film.

16. The panel display device of claim 12, wherein the metal shielding layer is isolated from a ground potential.

17. The panel display device of claim 12, wherein the power transmission layer comprises a third connection end for connecting another end of the transmission section, and a projection region of the third connection end is exposed by the metal shielding layer.

18. The panel display device of claim 17, further comprising a driver module connected to the third connection end, wherein the driver module generates a noise signal when a power signal is transmitting to the light-emitting device through the transmission section of the power transmission layer, and the metal shielding layer shields the noise signal.

19. The panel display device of claim 12, wherein an edge of the metal shielding layer is inside an edge of the substrate.

* * * * *